United States Patent [19]

Bhattacharyya et al.

[11] 4,094,057
[45] June 13, 1978

[54] FIELD EFFECT TRANSISTOR LOST FILM FABRICATION PROCESS

[75] Inventors: Arup Bhattacharyya; Ronald Silverman, both of Essex Junction, Vt.

[73] Assignee: International Business Machines Corporation, Armonk, N.Y.

[21] Appl. No.: 671,907

[22] Filed: Mar. 29, 1976

[51] Int. Cl.² .................................. H01L 21/26
[52] U.S. Cl. .............................. 29/571; 148/1.5; 148/175; 357/54; 29/579
[58] Field of Search ............... 148/187, 175, 1.5; 357/54; 29/576 B, 576 C, 576 E, 577, 578, 571

[56] References Cited

U.S. PATENT DOCUMENTS

| | | | |
|---|---|---|---|
| 3,351,825 | 11/1967 | Vidas et al. | 357/54 |
| 3,791,024 | 2/1974 | Boleky et al. | 147/187 X |
| 3,894,891 | 7/1975 | Magdo et al. | 148/187 X |
| 3,919,060 | 11/1975 | Pogge et al. | 148/175 X |

*Primary Examiner*—G. Ozaki
*Attorney, Agent, or Firm*—Francis J. Thornton

[57] ABSTRACT

This describes a process for fabricating transistor memory cell arrays which includes forming a thin oxide which is continuous over the entire area and which is continuously protected from the time it is deposited so that subsequent processing steps will not cause any change in the thickness of the thin oxide except where deliberately desired. By first depositing a protective masking film and subsequently removing this film in a series of steps, so that this film is lost in the fabrication process, the need for using the dual dielectric insulating layers required in the prior art can be eliminated. By eliminating such dual dielectric insulating layers the performance and density of the arrays can be improved.

Semiconductor arrays are formed by providing at a surface of a semiconductor substrate a pair of isolation lines and a plurality of conductive lines orthogonal to the isolation lines. Signal or bias voltages are applied to selected or predetermined conductive lines to provide control electrodes or field shields for the transistors. When the substrate has deposited on its surface an insulating medium, the dopant may be ion implanted through the insulating medium to form, e.g., the source and drain electrode of the transistors. Other elements may be added to the structure to form, e.g., a memory cell.

12 Claims, 7 Drawing Figures

FIELD EFFECT TRANSISTOR LOST FILM FABRICATION PROCESS

BACKGROUND OF THE INVENTION

1. Field of the Invention

This invention relates to self-aligned arrays of field effect transistors. More specifically, the invention relates to a process for making self-aligned field effect memory cells which form a very high density memory array.

2. Description of the Prior Art

Integrated circuits, particularly those employing field effect transistors formed in a semiconductor substrate, have achieved very high densities of active and passive components. One of the simplest circuits for providing a memory cell is described in commonly owned U.S. Pat. No. 3,387,286, filed July 14, 1967, by R. H. Dennard. This cell employs a single field effect transistor as a switch for coupling a capacitor to a bit sense line. In also commonly owned U.S. Pat. Nos. 3,811,076 by W. M. Smith, and 3,841,926, by R. H. Garnache, both filed Jan. 4, 1973, there is disclosed a one device field effect transistor memory cell of the type described in the above identified Dennard patent which utilizes a layer of polycrystalline silicon as a field shield and as an electrode for a storage capacitor in order to improve cell density. To further improve the density of the cells described in U.S. Pat. Nos. 3,811,076 and 3,841,926, the process for making the cells utilizes a dual layer of silicon nitride and silicon dioxide and polysilicon conductive layers or lines.

In U.S. Pat. No. 3,711,147, filed Dec. 4, 1972, there is disclosed a one device field effect transistor memory cell wherein a first level metal, tungsten, is used to provide a self-aligned gate, a single contact at the drain is utilized for two adjacent cells and a metallic layer held at a reference potential serves as an electrode for the storage capacitor.

In U.S. Pat. No. 3,657,029 there is disclosed a process in which platinum thin film metallization is selectively etched with aqua regia using chromium or titanium as an etch resistant mask.

In U.S. Pat. No. 3,648,125, filed Feb. 2, 1971, there is disclosed a process for making integrated circuits which includes forming electrically isolated pockets by a grid of oxidized silicon extending into silicon material, and in the periodical, *Electronics*, Sept. 11, 1972, page 31, there is a suggestion that the use of oxide isolation techniques be employed for making single transistor memory cells.

Electrical isolation techniques wherein a polysilicon grid is used to produce islands of single crystal silicon is disclosed in U.S. Pat. No. 3,736,193, filed July 29, 1969.

Field effect transistors having silicon gates with a nitride-oxide gate dielectric are suggested in U.S. Pat. No. 3,699,646, filed Dec. 28, 1970, and in the periodical, *Electronics*, dated Aug. 2, 1971, on page 74.

By employing the techniques disclosed in the above identified patents and articles, the semiconductor industry has produced semiconductor circuits or cells which contain thousands of circuits or cells on each small semiconductor substrate or chips, which are generally made of silicon.

RELATED PATENT APPLICATIONS

A commonly assigned copending patent application Ser. No. 617,462 of Anatol Furman et al, entitled, "Self Aligned Integrated Circuits" and filed on Sept. 29, 1975, now U.S. Pat. No. 4,021,789 describes a method of making a memory cell by forming a plurality of spaced apart isolation mediums at the surface of the substrate and a plurality of spaced apart conductive lines arranged to extend between an adjacent pair of isolation mediums and insulated from the substrate by a dual layer of silicon dioxide and silicon nitride.

SUMMARY OF THE INVENTION

It is an object of this invention to provide an improved process for making field effect transistor memory arrays which further increase the component density in semiconductor chips while eliminating the need for dual dielectric insulating layers.

It is another object of this invention to provide a very high density semiconductor array which can be fabricated by employing higher resolution, smaller printable lithography techniques such as E-beam, i.e. electron-beam techniques without adversely affecting the electrical characteristics of the devices in the array.

Yet another object of this invention is to provide a process for producing an array employing both active and passive components at densities no less than those attainable for circuits employing only the field effect transistors.

Yet a further object of this invention is to provide an improved process for making in a semiconductor substrate an array of high density field effect transistors having elements all of which are self-aligned and wherein the transistors are electrically isolated from each other within the substrate.

In accordance with the teachings of an aspect of this invention, a method is provided for making an improved field effect transistor in a semiconductor substrate by forming a plurality of spaced apart isolation lines in the surface of the substrate and by forming, with the use of a subsequently lost masking film, a plurality of spaced apart anodizable conductive lines arranged to extend between an adjacent pair of isolation lines and insulated from the substrate. The surface areas of the substrate bound by the isolation lines and conductive lines define source and drain regions of the transistor with the conductive line, disposed between a source and a drain, forming the gate electrode of the transistor. The insulation on the substrate surface beneath the conductive lines is a single layer insulator of silicon dioxide. The source and drain regions may be formed by using well known ion implantation techniques.

In accordance with a further aspect of this invention, a very small size memory cell having improved electrical performance is made by depositing a conductive material over the single layer insulator segment covering the source region of the transistor to form a storage capacitor between the source region and the conductive material. The segment of the single layer insulator over the drain region may be etched away and an appropriate conductive contact made to this region. By applying appropriate word pulses to the gate electrode and bit pulses to the drain region and a reference voltage to the conductive material, a small one device memory cell is provided of the type described and claimed in the above identified Dennard patent. Furthermore it can be seen that by applying appropriate reference or bias voltages to the conductive lines adjacent to the gate electrode, the cell becomes isolated in one dimension along the substrate surface by the adjacent lines which act as field shields and in the other dimension by the isolation lines.

The isolation lines may be in the form of a line of recessed oxide in the semiconductor substrate in a direction orthogonal to the field shield provided by the conductive lines. The process for making the cell is simplified by having conductive lines made of a material capable of being anodically self insulatable.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1A:
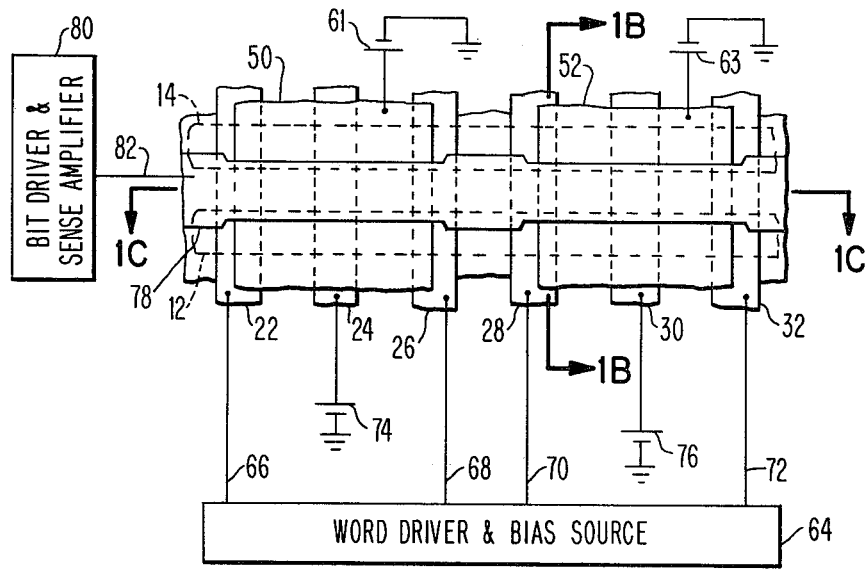
FIG. 1A is a plan view illustrating a matrix on a semiconductor substrate used for forming a memory cell array using field effect transistors and capacitors formed in accordance with the process of the invention.
Figure 1C:
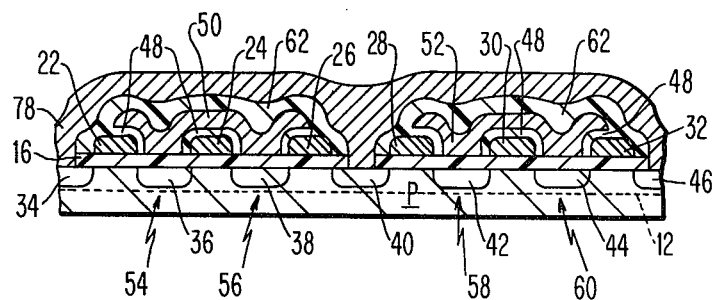
FIG. 1C is a section taken through FIG. 1A at 1C—1C.
Figure 1B:
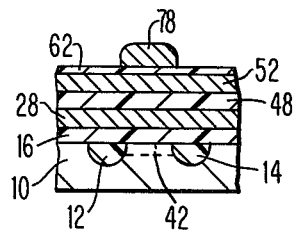
FIG. 1B is a section taken through FIG. 1A at 1B—1B.

Referring to FIGS. 1A, 1B and 1C in more detail, there is shown a semiconductor substrate 10 having recessed oxide strips 12 and 14 formed therein to a depth sufficient to hold off high voltage excursions. These recessed oxide strips 12 and 14 may be made by any of the well known recessed oxidation processes. Disposed on the surface of the semiconductor substrate 10 is a layer 16 of silicon dioxide. Disposed orthogonal to the direction of the isolation strips 12 and 14 are a plurality of conductive lines 22, 24, 26, 28, 30 and 32 overlying the layer 16. Source and drain regions 34, 36, 38, 40, 42, 44 and 46 are provided in the P-type semiconductor substrate 10, preferably made of silicon, by introducing suitable N-type impurity materials therein as is well known. The source and drain regions 34 through 46 may be formed in substrate 10 by employing well known ion implantation techniques, the ions penetrating through the silicon dioxide layer 16, to preferred depths in substrate 10. As desired, a layer of insulation 48, indicated in FIGS. 1B and 1C, is formed on the conductive lines 22 through 32 to a given thickness.

It can be seen that the structure illustrated in FIGS. 1A, 1B and 1C produces several field effect transistors which may be connected in any suitable manner. For example, region 34 may be used as a drain and region 36 as a source to form an N-channel field effect transistor having conductive line 22 as the gate electrode by making appropriate connections to regions 34 and 36 through layer 16 and through insulator 48 to conductive line 22. Other regions, such as 38 and 40, may be used as the selected drain and source, respectively, in a transistor utilizing conductive line 26 as the gate electrode. Furthermore, it can be seen that by applying an appropriate bias potential on, for example, conductive line 24, the transistor utilizing conductive line 22 as a gate electrode is isolated from the transistor utilizing conductive line 26 as the gate electrode. Other conductive lines and source and drain regions may be used to form other transistors and other conductive lines may be used as field shields for isolating the transistors from one another by simply applying an appropriate bias voltage to the other conductive lines in a well known manner. It can also be seen that the source and drain regions, for example, region 42 as shown in FIG. 1B, has one dimension which is defined by the isolation strips 12 and 14 and another dimension which is defined by conductive lines 28 and 30 as seen more clearly in FIG. 1C. It should be noted that the area of the region is not determined by the alignment of masks used to produce the isolation strips 12 and 14 or the conducting lines 28 and 30 but by the geometries produced or spacings formed in each of the masks. Accordingly, the source and drain regions are not affected by the alignment of masks and, therefore, provision need not be made for misalignment of masks when determining the sizes of the transistors.

To use this structure as a memory cell array, it is necessary that reference or ground planes 50 and 52 be disposed over the insulated conductive lines 22 through 32. As can be seen more clearly in FIG. 1C, the reference plane 50 is insulated from conductive lines 22, 24 and 26 by the insulating layer 48. Also it should be noted that the reference plane 50 is in contact with the surface of the silicon dioxide layer 16 between conductive lines 22 and 24 and between conductive lines 24 and 26 to form with a current-carrying region 36, preferably a source, a storage capacitor 54, and with region 38, also preferably a source region, a storage capacitor 56. Reference plane 52 is similarly disposed over conductive lines 28, 30 and 32 to form with region 42 a storage capacitor 58 and with region 44 a storage capacitor 60. The reference planes 50 and 52 may be connected to voltage sources 61 and 63, respectively. An insulating layer 62 is formed over the reference planes 50 and 52. A word driver and bias source 64 has output 66, 68, 70 and 72 connected to conductive lines 22, 26, 28 and 32, respectively. These conductive lines 22, 26, 28 and 32 are used as word lines for the memory cell. Conductive lines 24 and 30 are used as field shields by applying an appropriate reference voltage to them from voltages sources 74 and 76, respectively. By providing contact holes in layer 16 over regions 34, 40 and 46, for use as drain regions, an appropriate bit line 78 may be ohmically connected to these drain regions. A bit driver and sense amplifier 80 has an output 82 connected to the bit line 78. It can be seen that the segment of the memory array illustrated in FIGS. 1A, 1B, and 1C provides for memory cells, each coupled to bit line 78 and controlled by gate electrodes 22, 26, 28 and 32. Isolation between the cells is provided by conductive lines 24 and 30. More specifically, the four cells of the memory array include a first cell which has storage capacitor 54 and a transistor formed by the gate electrode 22, drain region 34, and source region 36, a second cell having storage capacitor 56 and a second transistor formed by gate electrode 26, drain region 40 and source region 38, a third cell having storage capacitor 58 and a third transistor having gate electrode 28, drain region 40 and source region 42, and a fourth cell having storage capacitor 60 and a fourth transistor having a gate electrode 32, a drain region 46 and a source region 44. As is known, by applying a bias voltage to reference planes 50 and 52, the source regions 36, 38, 42 and 44 need not be diffusions but can be inversion layers. Although only one row of cells connected to bit line 78 is illustrated in the drawing of FIGS. 1A, 1B and 1C, it should be understood that additional rows are providing having bit lines parallel to bit line 78.

In the known operation of this type of memory array, in order to write information into a cell, for example, into storage capacitor 56, a pulse is applied to the gate electrode 26 from the word driver and bias source 64 through output 68 to render the transistor having electrode 26 and regions 38 and 40 conductive. If a 1 bit of information is to be stored in capacitor 56, a pulse is also applied to the bit line 78 from the bit driver and sense amplifier 80 through output 82 to place a charge on capacitor 56. If a 0 bit of information is to be stored in capacitor 56, a pulse would not be applied to bit line 78 and, therefore, capacitor 56 would not be charged. In order to read information stored in capacitor 56, a pulse from the word driver and bias source 64 is applied to gate electrode 26 through output 68 to again turn on the transistor having electrode 26, and regions 38 and 40. If a 1 has been stored in capacitor 56, the capacitor will have a charge thereon which will be discharged through the gate region of the transistor between regions 38 and 40 to bit line 78. This charge is detected in the sense amplifier 80. If a 0 bit of information had been stored in capacitor 56, the capacitor could not discharge and, therefore, charge would not be sensed by sense amplifier 80. It can be seen that in order to write information into storage capacitor 58 or to read information therefrom, the transistor having gate electrode 28, drain region 40 and source region 42 is employed, a pulse being applied from word driver and bias source 64 to gate electrode 28 through output 70 and a bit pulse, if necessary, being applied to bit line 78 in the same manner as described hereinabove in connection with the storage of information in capacitor 56. Sense amplifier 80 is also used to read the information from storage capacitor 58. Likewise storage capacitors 54 and 60 utilize the common bit line 78 but are driven by the word drive and bias source 64 from lines 66 and 72, respectively.

Although only four cells are shown coupled to the bit line 78, it should be understood that many more cells similarly arranged may be coupled to this line. It should also be noted that drain electrode 40 is used as a common drain electrode for accessing both the storage capacitor 56 and the storage capacitor 58. It should be noted further that when, for example, storage capacitor 58 is being accessed under the control of gate electrode 28, a bias voltage from the word driver and bias source 64 may be applied to output 68 to render conductive line 26 active as a field shield isolating the cell having storage capacitor 58 from voltage excursions which may occur in the semiconductor substrate 10 at its left, as shown in FIG. 1C of the drawing, while the conductive line 30 connected to the bias voltage source 76 acts as a field shield for the cell having storage capacitor 58 from all voltage excursions which may occur in the semiconductor substrate 10 at its right. It can be seen that with the conductive lines adjacent to both sides of the gate electrode of a transistor being used as field shields to isolate the memory cell in one dimension and with the recessed oxide strips 12 and 14 isolating the cells in the other dimension, each of the cells are fully protected from voltage excursions which may occur in the semiconductor substrate 10 outside of the selected or addressed cell area. Since each of the cells are completely isolated from the other cells in the array and since they are formed free of mask misalignments, a highly dense memory array is produced.

A specific process which may be used to produce the structure illustrated in FIGS. 1A, 1B and 1C will be discussed in conjunction with FIGS. 2A, 2B, 2C and 2D, and includes the following sequence of steps.

For the sake of clarity only two cells will be shown in FIGS. 2A, 2B, 2C and 2D and they will be the first cell having storage capacitor 54 and a transistor formed by gate electrode 22, drain region 34 and source region 36 and the second cell having storage capacitor 56 and a second transistor formed by gate electrode 26, drain region 40 and source region 38. The recessed oxide strips 12 and 14 are first developed within the semiconductor substrate 10 to a depth sufficient to hold off high voltage extremes by etching grooves in the body followed by a high temperature oxidation step. Once these strips are formed the surface of the semiconductor substrate is stripped and cleaned without disturbing these strips 12 and 14. On the clean surface a thin oxide 16, about 500 Angstroms thick, suitable as a gate oxide is thermally grown.

Figure 2B:
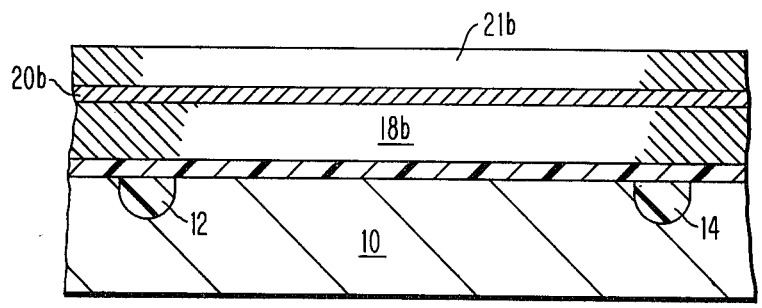
FIG. 2B is a sectional view taken along 2B—2B of FIG. 2A.
Figure 2A:
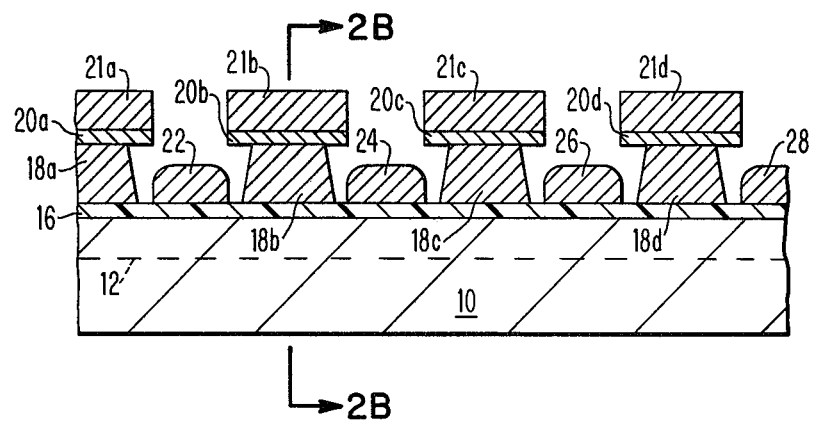
FIG. 2A is a sectional view depicting one step in the production of the matrix of FIG. 1A.
Figure 2C:
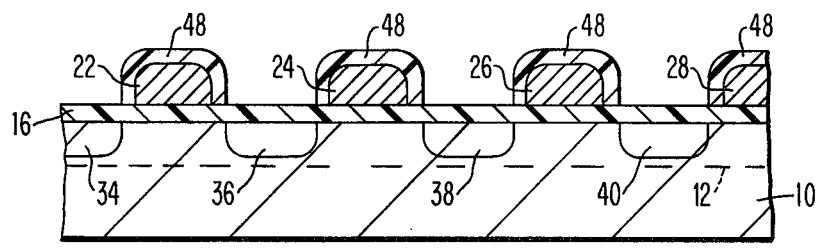
FIG. 2C is a sectional view depicting a further step in the production of the matrix of FIG. 1A.

Over this oxide layer 16, a protective masking film of aluminum, approximately 10,000 Angstroms in thickness is deposited using any well known evaporation technique. Over this aluminum layer a silicon layer approximately 600 Angstroms thick is evaporated. This silicon layer is now masked with a suitable photoresist and etched using a known hydrofluoric-nitric acid solution into a series of lines 20a, 20b, 20c and 20d elongated in a direction orthogonal to the recessed oxide strips 12 and 14. Once formed the photoresist is removed and these lines 20a, 20b, 20c and 20d now act as a mask for the underlying aluminum film which is now etched into a series of separated lines 18a, 18b, 18c and 18d. This aluminum film is etched using a phosphoric-nitric acid solution which will not attack the overlying silicon lines 20a, 20b, 20c and 20d. As shown in FIG. 2A the defined aluminum lines have tapered sides and tops narrower than the defining silicon lines 20a, 20b, 20c and 20d due to the nature of the chemical etching process itself. Because the etchant used to remove the aluminum film is restricted only by the overlying silicon lines 20a, 20b, 20c and 20d it freely attacks and erodes the film exposed in the opening between the overlying silicon lines. This attack on the film occurs in all directions at the same rate. Thus the aluminum is etched away not only directly under the opening but is also etched laterally to undercut the overlying silicon lines 20a, 20b, 20c and 20d. The amount of undercut is equal to approximately the thickness of the aluminum film.

The aluminum lines 18a, 18b, 18c and 18d thus etched become smaller than the overlying silicon lines 20a, 20b, 20c and 20d. Once the aluminum lines have been so defined polysilicon about 6,000 Angstroms thick is deposited over the entire unit. This polysilicon can be formed, for example, by evaporation. Because the polysilicon deposit has less thickness (6,000 A) than the aluminum lines (10,000A) it overlies the silicon lines 20a, 20b, 20c and 20d as lines 21a, 21b, 21c and 21d and forms between the silicon lines 20a, 20b, 20c and 20d as lines 22, 24, 26 and 28.

Once this polysilicon is deposited it preferably is rendered highly conductive so as to have a low impedance by doping it. Because it is desirable at this point in the process to keep temperatures to which the unit is to be exposed below 800° C, this polysilicon may be deposited by an ion implantation technique, or an insitu doped evaporation technique both of which are well known to the art. Preferably this polysilicon deposit is doped to a level greater than $10^{19}$ ions/cm$^3$ so that its resistivity is fairly low e.g., 005Ωcm. This ion implantation is preferably controlled so that the underlying body 10 is not further doped. In this instance P-type doping is preferred and 50keV boron ions having a fluence of $5 \times 10^{15}$ to $1 \times 10^{16}$ ions/cm$^2$ will be used. The conductive polysilicon lines 22, 24, 26 and 28 are then heavily oxidized by a well known anodization process to produce an insulating layer 48 of approximately 3,000 Angstroms. This anodization step is preferably performed at a temperature in the range of about 250° C to 400° C by placing the unit in a RF glow discharge tube containing an atmosphere of oxygen reduced to about 0.1 Torr. The oxide coating so created allows subsequent depositions of conductive materials without the need for further insulation on the conductive lines 22, 24, 26 and 28. It should now be noted that during this anodizaion process the thin gate oxide layer 16 remains covered with either the aluminum lines 18a, 18b, 18c and 18d or the silicon lines 22 to 28. Thus the thin gate oxide layer 16 under these lines is unaffected by this anodization process and remains at its original thickness of about 500 Angstroms.

This anodization process will also form a thin aluminum oxide ($Al_2O_3$) coating on the aluminum. However, this can readily disolve in a hydrochloric acid solution heated to about 80° C which also dissolves the aluminum lines 18a, 18b, 18c and 18d causing the overlying silicon lines 20a, 20b, 20c, 20d, 21a, 21b, 21c and 21d to be lifted off the surface of the unit exposing the regions of the surface of the thin oxide layer 16 between the oxidized, conductive and insulated polysilicon lines 22, 24, 26 and 28.

Once these regions are exposed the unit is again ion implanted to form a plurality of source and drain regions 34, 36, 38 and 40 approximately 500 to 2,000 Angstroms deep. In this instance an N-type dopant is desired to form the regions 34, 36, 38 and 40 and so either phosphorous or arsenic will be used as the doping ions. Preferably 200 to 300 Kev arsenic dopant ions having a fluence of $5 \times 10^{15}$ to $1 \times 10^{16}$ ions/cm$^2$ will be used to achieve this doping. The oxide coating 48 on the silicon lines 22, 24, 26 and 28 is sufficiently thick enough to prevent these ions from being implanted in the silicon lines 22, 24, 26 and 28.

If it is desired, other regions on body 10 be protected from this ion implantation using photoresist coatings.

Once this ion implantation step has been completed the oxide layer 16 overlying the electrodes 34, 36, 38 and 40 can be removed. This removal is not necessary and need be practiced only if a material having a higher permittivity, than the oxide layer 16 is to be deposited over the regions 34, 36, 38 and 40. In any event such a removal and redeposition step, if practiced, must be performed at a low temperature, i.e., under 800° C so that excessive diffusion of the implanted regions is prevented. In any event such a removal step must be practiced such that oxide layer 16 under the deposited silicon lines 22, 24, 26 and 28 is not disturbed.

It will be assumed, however, that this oxide layer 16 over the regions 34, 36, 38 and 40 is not removed. Thus subsequent to the ion implantation of the regions an evaporated layer of aluminum 10,000 Angstroms thick is deposited over the entire unit. Once again this aluminum deposit is coated with a 600 Angstrom thick evaporated layer of silicon.

This silicon layer is now masked with photoresist and etched with a hydrofluoric-nitric acid solution into a series of lines 25a and 25b, again elongated in a direction orthogonal to the recessed oxide strips 12 and 14. These lines 25a and 25b now act as a mask for the underlying aluminum film which is now etched into a series of separated lines 23a and 23b. Once again this aluminum film is etched using a phosphoric-nitric acid solution which will not attack any of the silicon lines or silicon oxide layers 48.

Figure 2D:
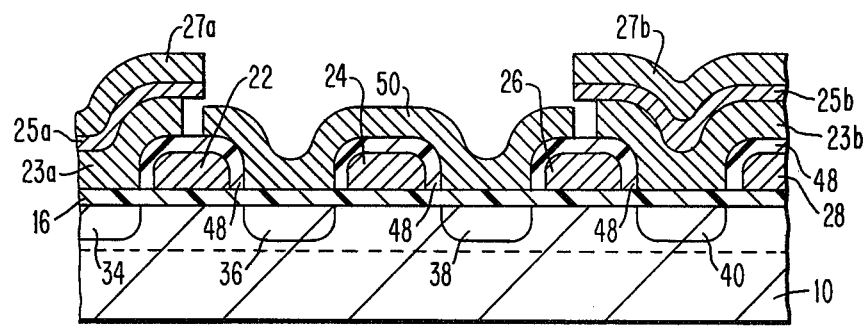
FIG. 2D is a sectional view depicting a further step in the production of the matrix of FIG. 1A.

As shown in FIG. 2D the entire region between electrodes 22 and 26 is cleared of the silicon and aluminum films. Once the lines 23a and 23b have been defined a deposit of polysilicon about 6,000 Angstroms thick is laid down over the unit to create layers 27a and 27b over the lines 23a and 23b and a storage capacitor plate or reference plane 50 overlying electrode 24 and regions 36 and 38. To assure full coverage this reference plane 50 is made to partially extend over electrodes 22 and 26.

This polysilicon layer is now doped with dopants to render it high conductive. The same techniques and values for doping lines 22, 24, 26 and 28 described above can be used to dope this plate 50.

This conductive silicon plate 50 is now heavily oxidized by the above described anodization process and a 3,000 Angstrom thick insulating layer 62 is created thereon. Following this anodization step the aluminum and silicon layers 23a, 23b, 25a, 25b, 27a and 27b are removed by the above described hot hydrochloric acid process.

At this time a brief heat treatment to activate the implanted ions and to drive the junction to the desired depth, for example, to a depth of 1,500 to 2,000 Angstroms is performed by heating the unit to between 900° C and and 1,000° C for between 15 and 60 minutes.

The well known so called dip etch process is now employed to provide an opening in the thin oxide layer 16 overlying the drain regions 34, 40 and 46. A metal layer, preferably an aluminum-silicon, is now deposited in contact with drain regions 34, 40 and 46 and is suitably etched to form the bit line 78. The unit is now heat sintered at between 350° C and 400° C, in the known manner, to provide good ohmic contacts between the bit line 78 and the drain regions.

It should be noted that in forming the memory cell array the storage capacitor plates or ground planes 50 and 52 need not be critically aligned because of the overlap utilized at the oxidized polysilicon lines 22 through 32. The only alignment required for the plates 50 and 52 is that the edges thereof fall over the gate electrodes 22 and 26, and 28 and 32, respectively. Because there is no gap in the storage capacitor, the capacitor size is not a function of alignment.

By following the above described process the neeed for using a silicon nitride layer is eliminated assuring improved performance by eliminating this charge entrapment site which can adversely affect performance. The thin dielectric reliability of the storage capacitor can be further improved, if desired, by properly biasing the plates 50 and 52. It should be further noted that in place of the polysilicon for the gate electrodes, field shields and capacitor plates, a refractory metal, such as tantalum, may be used with anodic tantalum oxide forming the insulation barrier between conductive members of the memory array. It should also be noted that materials other than polycrystalline silicon or tantalum may be used for the conductive lines 22 to 32 and plates 50 and 52, however, it is preferred that the conductive material used by anodically insulatable.

Although the isolation medium strips have been disclosed as being recessed oxide strips 12 and 14 or as it should be understood that other isolation medium strips may be employed, if desired, such as thick oxide, aluminum oxide, tantalum oxide or highly doped semiconductor substrate strips.

The bit line 78 although indicated as being made of metal, may be made, if desired, of polysilicon in order to produce an array which has all conductive lines made of conductive polysilicon strips which are readily insulated by appropriate processes. An advantage of using the oxidized polysilicon strips is that the incidence of shorts between conductive lines would be almost entirely eliminated. Also, if desired, the conductive lines in the memory arrays may be made of oxidizable refractory metal to produce thinner and lower impedance lines with the intended improvements in surface topology and performance.

Although the above described embodiment concerned a field effect transistor it should be understood that the teachings of this invention can be used to produce other semiconductor devices such as bipolar transistors or charge transfer devices.

Also it should be noted that other materials can be used, for example, for the masking material any noble metal or any refractory metal or alloy having an oxide which can be dissolved in a solution that will not attack the anodized layer of the anodizable material can be used. Also the anodizable material is preferably taken from the class comprising silicon, tantalum, zirconium, niobium and thorium.

While the invention has been particularly shown and described with reference to preferred embodiments thereof, it will be understood by those skilled in the art that various changes in form and details may be made therein without departing from the spirit and scope of the invention.

What is claimed is:

1. A method for forming an electrical circuit in an isolated pocket of semiconductor material including a transistor having a control electrode and at least one current carrying electrode comprising the steps of:
   forming a thin insulator at the surface of said semiconductor material,
   depositing a masking material on said insulator,
   selectively etching said deposited mask material to define a plurality of openings in said mask,
   depositing an anodizable conductive material in the openings defined in said mask material,
   anodizing the surface of said anodizable material,
   selectively removing the remainder of said mask material,
   forming source and drain regions in said semiconductor material, and
   depositing conductive material to form an electrical connection to one of said source and drain regions.

2. The method of claim 1 wherein said isolated pocket of semiconductor material is formed by,
   forming a pair of spaced apart isolation strips at the surface of said semiconductor material.

3. The method of claim 2 wherein said anodizable material is deposited as a plurality of spaced apart elongated lines disposed in a direction substantially perpendicular to said isolation strips.

4. The method of claim 3 wherein said thin insulator is formed of a uniform layer of silicon dioxide.

5. A method as set forth in claim 4 wherein said isolation strips are deposited parallel to each other.

6. A method as set forth in claim 5 wherein said strips are formed by recessing oxide strips in said semiconductor material at the surface thereof.

7. A method as set forth in claim 5 wherein said isolation strips are formed by depositing additional conductive lines insulated from the surface of said semiconductor material on the surface of said material.

8. The method of claim 1 wherein there is further provided the steps of:
   forming said isolated pocket of semiconductor material by forming a pair of spaced apart isolation strips at the surface of said semiconductor material,
   depositing said anodizable material as a plurality of spaced apart enlongated lines in a direction substantially perpendicular to said isolation strips,
   applying a signal voltage to the selected one of said anodizable conductive lines, said selected line one of said lines being a control electrode of a field effect transistor, and
   applying a reference voltage to a second one of said anodizable conductive lines adjacent said selected line one of said lines to form a field shield for said field effect transistor.

9. The method as set forth in claim 8 wherein there is further provided the step of forming a capacitor on said semiconductor material in an area defined by said pair of isolation strips and said selected one of said anodizable conductive lines and said second one of said anodizable conductive lines by depositing a sheet of conductive material over said insulator between said selected one of said anodizable conductive lines and said second one of said anodizable conductive lines.

10. The method as set forth in claim 9 wherein there is further provided the steps of:
    coating said sheet of conductive material with an insulative material, and
    forming a conductive line over said insulative material in a direction substantially parallel to said insulation strips.

11. The method of claim 10 wherein said masking material is a noble metal and said anodizable material is selected from the class consisting of silicon, tantalum, zirconium, niobium and thorium.

12. The method of claim 10 wherein said masking material is a refractory material and said anodizable material is selected from the group consisting of silicon, tantalum, zirconium, niobium and thorium.

* * * * *